United States Patent
Cheong et al.

(10) Patent No.: US 6,517,737 B2
(45) Date of Patent: Feb. 11, 2003

(54) CERAMIC PIEZOELECTRIC AND DEVICES USING THE PIEZOELECTRIC

(75) Inventors: Sang-Wook Cheong, Chatham, NJ (US); Tae-Yeong Koo, Piscataway, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 47 days.

(21) Appl. No.: 09/798,707

(22) Filed: Mar. 2, 2001

(65) Prior Publication Data

US 2002/0123421 A1 Sep. 5, 2002

(51) Int. Cl.$^7$ ............................ C04B 35/00; C04B 35/46
(52) U.S. Cl. ............................ 252/62.9 R; 501/134; 501/135; 501/136
(58) Field of Search .................. 252/62.9 R; 501/134, 501/135, 136

(56) References Cited

U.S. PATENT DOCUMENTS 5,032,558 A * 7/1991 Bailey et al. ............... 501/134
5,759,432 A * 6/1998 Kumar et al. ............ 252/62.9 R
5,804,907 A * 9/1998 Park et al. .................. 310/357

OTHER PUBLICATIONS

"The Inket color Image, Born in a Rainbow of Tiny Drops" by Matt Lake, published at www.nytimes.com, (Dec. 5, 2000), 5 pages.

"Materials Science: Shape–Changing Crystals Get Shiftler" by Robert F. Service, Science vol. 275, (1997), p. 1878, No month.

"Ferroelectric Ceramics: History and Technology" by Gene H. Haertling, Journal of the American Ceramic Society, vol. 82(4), (1999), pp. 797–818, No month.

"Ultrahigh strain and piezoelectric behavior in relaxor based ferroelectric single crystals" by Seung–Eek Park et al, Journal of Applied Physics, vol. 82(4), (Aug. 15, 1997), pp. 1804–1811.

* cited by examiner

Primary Examiner—Elizabeth D. Wood
(74) Attorney, Agent, or Firm—John F. McCabe

(57) ABSTRACT

A device includes a polycrystalline body having a stoichiometry that is described by $[Pb(Mg_{1/3}Nb_{2/3}))O_3]_{(1-x)}[PbTiO_3]_x$. The value of x is in a range of about 0.31 to about 0.47.

11 Claims, 4 Drawing Sheets

CERAMIC PIEZOELECTRIC AND DEVICES USING THE PIEZOELECTRIC

BACKGROUND OF THE INVENTION

1. Field of the Invention

This invention relates to piezoelectric materials and devices that use piezoelectric materials.

2. Discussion of the Related Art

Piezoelectric materials respond to applied electric fields by physically deforming. The magnitude of the deformations that electric fields generate in single-crystal perovskites such as $Pb(Mg_{1/3}Nb_{2/3})O_3$—$PbTiO_3$(PMN-PT) and $Pb(Zn_{1/3}Nb_{2/3})O_3$—$PbTiO_3$(PZN-PT) are an order of magnitude larger than those that the fields generate in polycrystalline piezoelectrics such as $PbZrO_3$—$PbTiO_3$(PZT). The size of their piezoelectric responses make the crystalline perovskites promising materials for new piezoelectric devices.

Unfortunately, the fabrication of crystalline perovskites is complicated and expensive. On the one hand, high fabrication costs make the crystalline perovskites too expensive for use in many types of electromechanical devices. On the other hand, polycrystalline PZN-PT typically require high-pressure synthesis, which is prohibitively expensive to some commercial applications of PZN-PT.

Herein, PMN refers to $Pb(Mg_{1/3}Nb_{2/3})O_3$ and PT refers to $PbTiO_3$.

Herein, chemical symbols are used for lead (Pb), niobium (Nb), zinc (Zn), zirconium (Zr), magnesium (Mg), titanium (Ti), and oxygen (O).

SUMMARY OF THE INVENTION

In one aspect, the invention features a device that includes a polycrystalline body. The body has a stoichiometry described by $[Pb(Mg_{1/3}Nb_{2/3})O_3]_{(1-x)}[PbTiO_3]_x$. The value of x is in the range of about 0.31 to about 0.47.

In another aspect, the invention features a process to fabricate a solid body. The process includes forming a mixture of powdered oxides. The oxides include lead, magnesium, niobium, and titanium. The process also includes sintering the mixture to produce a polycrystalline body with a $[Pb(Mg_{1/3}Nb_{2/3})O_3]_{(1-x)}[PbTiO_3]_x$ stoichiometry. The value of x is in the range of about 0.31 to about 0.47.

In another aspect, the invention features an electromechanical device. The electromechanical device includes a support structure, a component moveable with respect to the support structure, and a piezoelectric device mechanically coupled to both the support structure and the component. The piezoelectric device includes a polycrystalline body and electrodes located on the body. The body has a composition with a stoichiometry described by $[Pb(Mg_{1/3}Nb_{2/3})O_3]_{(1-x)}[PbTiO_3]_x$. The value of x is in the range of about 0.31 to about 0.47.

DETAILED DESCRIPTION

Various embodiments include polycrystalline compositions of $Pb(Mg_{1/3}Nb_{2/3})O_3$ and $PbTiO_3$. These polycrystalline compositions are stoichiometrically described by $PMN_{(1-x)}PT_x$. The compositions have piezoelectric responses to applied electric fields. The magnitudes of the piezoelectric responses depend on the values of "x" defining the stoichiometries of the compositions. The values of "x" also define the crystalline structures of the compositions. Heightened piezoelectric responses occur for x's corresponding to tetragonal polycrystalline structures located near the morphotropic phase boundary (MPB).

Figure 1:
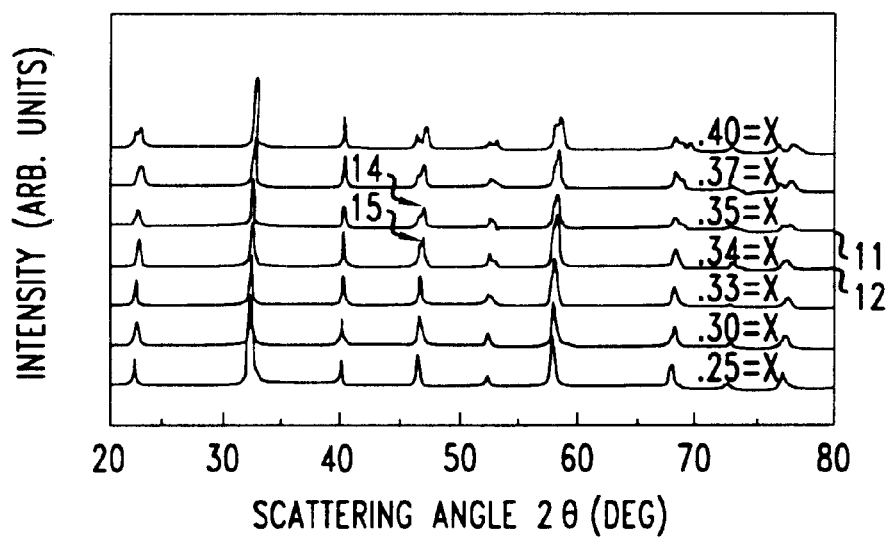
FIG. 1 shows x-ray diffraction patterns of ceramic compositions with the stoichiometry $(PMN)_{(1-x)}(PT)_x$.

FIG. 1 shows x-ray diffraction spectra 11, 12 of polycrystalline bodies with stoichiometries described by $(PMN)_{(1-x)}(PT)_x$. The spectra 11, 12 depend on x-ray scattering angle θ and the stoichiometric parameter "x". The value of "x" that corresponds to the MPB is identifiable from x-ray diffraction spectra 11, 12. For values of "x" on one side of the MPB, a split peak 14 exists in the x-ray pattern 11. The split peak 14 indicates the presence of tetragonal domains in the polycrystalline composition. For values of "x" on the other side of the MPB, the corresponding peak 15 in the x-ray pattern 12 is no longer split. The presence of the non-split peak 15 indicates a rhombohedral phase.

Figure 2:
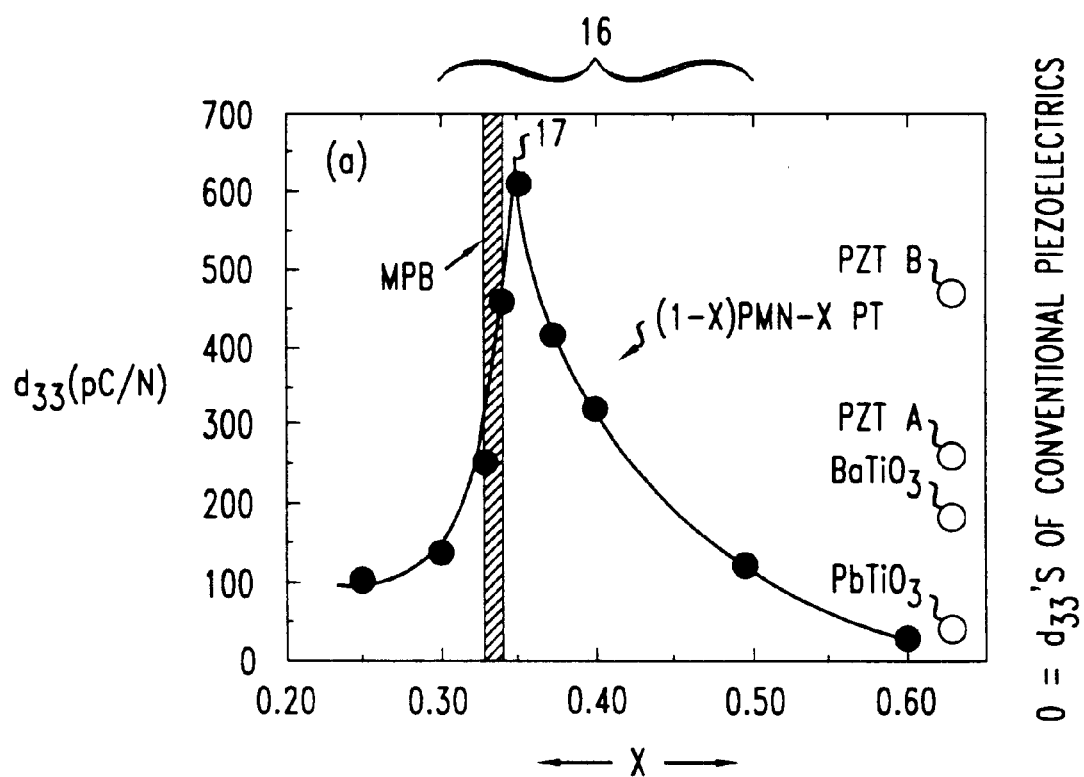
FIG. 2 shows the piezoelectric responses of the compositions of FIG. 1.

FIG. 2 shows piezoelectric responses of various polycrystalline compositions whose stoichiometries are described by $(PMN)_{(1-x)}(PT)_x$. The piezoelectric responses of the compositions are measured by values of a coefficient $d_{33}$ defined by $d_{33}=dP_3/dE_3$. The coefficient $d_{33}$ defines the polarization $P_3$ produced along the direction of the applied electric field $E_3$. The value of $d_{33}$ depends on the number "x", which defines a composition's stoichiometry.

The compositions of $(PMN)_{(1-x)}(PT)_x$ exhibit a peak 16 in coefficient $d_{33}$ near the morphotropic boundary (MPB) that separates different grain structures for the polycrystalline compositions. The MPB corresponds to a value of x in the range of about 0.33 to about 0.34. The maximum 17 of the peak 16 in the value of $d_{33}$ occurs for an "x" equal to about 0.35.

For values of x greater than about 0.32 and smaller than about 0.4, polycrystalline compositions of $(PMN)_{(1-x)}(PT)_x$, have larger coefficients $d_{33}$ than conventional polycrystalline ceramics of PZT, shown as PZT-A and PZT-B. In the range of "x$\geq$0.35", the compositions of $(PMN)_{(1-x)}(PT)_x$ have tetragonal crystalline domain structures.

The unit cell of a tetragonal crystal is a parallelepiped in which one side has a different length than the other two sides. The side with the different length has different orientations in different crystalline domains. In such compositions, a piezoelectric response, in addition to the intrinsic contribution, is produced through realigning the various crystalline domains of the composition along the applied electric-field direction. For compositions near the MPB, individual tetragonal crystalline domains are more easily realigned by a poling operation than for compositions whose value of "x" places them farther away from the MPB. The poling operation includes applying an electric field to a composition.

For values of "x" greater than or equal to about 0.35, compositions of $(PMN)_{(1-x)}(PT)_x$, have tetragonal polycrystalline structures. For values of "x" greater than about 0.32 and less than about 0.47, these compositions have larger coefficients $d_{33}$, i.e., larger piezoelectric responses, than polycrystalline compositions based on $BaTiO_3$ or $PbTiO_3$.

Figure 3:
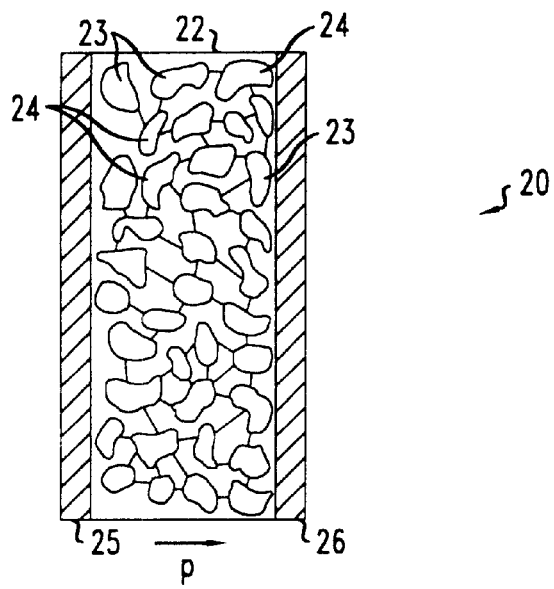
FIG. 3 is a cross-sectional view of a slab-shaped piezoelectric device.

FIG. 3 shows a piezoelectric device 20 that includes a slab-shaped solid body 22 and gold electrodes 25, 26 located on opposite sides of the slab-shaped body 22. The solid body 22 has a polycrystalline structure and a stoichiometric composition $(PMN)_{(1-x)}(PT)_x$. The number "x" has a value greater than about 0.31 and smaller than about 0.47, and in preferred embodiments, "x" is greater than about 0.32 and less than about 0.40. The polycrystalline structure is formed by crystalline grains 23, 24 with different orientations and diameters smaller than about 10 microns. The solid body 22 has a piezoelectric response to applied electric fields.

In some embodiments, solid body 22 also includes a dopants that make up not more 2 percent of the weight of the solid body 22. The presence of the dopants may increase the piezoelectric response of the solid body 22 as compared to an undoped body of the otherwise same composition. Exemplary dopants include lanthanum, cobalt, cobalt plus lanthanum, thorium, rhodium, and iridium. Combinations such as thorium plus iridium, indium plus manganese, sodium plus gallium, indium plus gallium, gallium plus iron, cobalt plus tantalum, and cobalt plus tungsten may also be used to dope solid body 22.

The gold electrodes 25, 26 are used to apply a voltage across the width of the solid body 22.

The solid body 22 has a permanent anisotropic axis "P" of maximal dielectric response. The axis "P" is perpendicular to the surfaces of electrodes 25, 26. The piezoelectric response of the body 22 corresponds to a coefficient $d_{33}$ with a value greater than about 500 pico-coulombs per Newton (pC/N). In exemplary solid bodies 22, the coefficient $d_{33}$ has a value of about 610 pC/N or larger.

Figure 4:
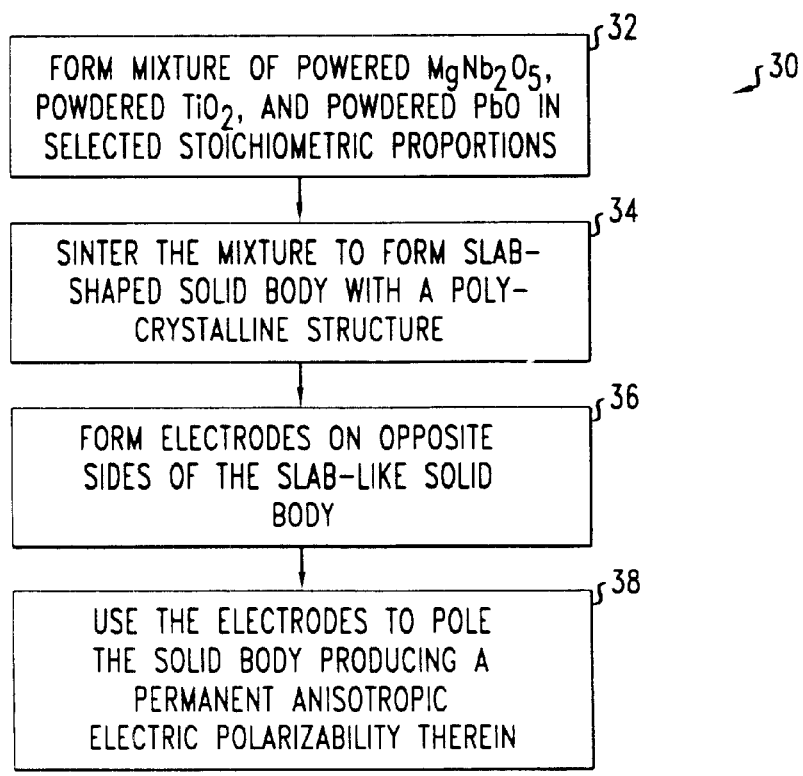
FIG. 4 is a flow chart showing a process for fabricating the piezoelectric device of FIG. 3.

FIG. 4 is a flow chart for a process 30 for fabricating a piezoelectric device 20 of FIG. 3. Fabrication process 30 includes forming a sintering mixture of powdered $MgNb_2O_6$, powdered $TiO_2$, and powdered PbO (step 32). In the sintering mixture, proportions are selected to produce a desired stoichiometric composition of solid body 22 after sintering. Multiple sinterings are performed on the mixture of oxide powders to produce polycrystalline solid body 22 in a selected shape (step 34). To compensate for evaporation of lead at the sintering temperatures, the mixture includes an additional amount of PbO powder. Performing high-temperature sintering steps in a closed container reduces vaporization of lead.

The sintering produces a solid body 22 that is described by a stoichiometric formula $(PMN)_{(1-x)}(PT)_x$. The stoichiometric parameter "x" is greater than or equal to about 0.31 and smaller than or equal to about 0.47. For better piezoelectric responses, some exemplary fabrication processes form the solid body with a composition in which x is greater than about 0.32 and less than about 0.40.

After the sintering, metallic electrodes 25, 26 are formed on opposite surfaces of the solid body 22 to produce an electromechanical device (step 36). The electrodes 25, 26 are used to pole the solid body 22 with a strong electric field (step 38). The poling generates a permanent anisotropic polarizability along a direction perpendicular to the electrodes 25, 26 by permanently realigning crystalline domains in the solid body 22.

An exemplary embodiment of the fabrication process 30 of FIG. 4 is described below.

To perform the exemplary embodiment, powdered $MgNb_2O_6$ is made. To make the powdered $MgNb_2O_6$, powdered MgO is dried and combined with powdered $Nb_2O_5$ to form a mixture with equal molar amounts of MgO and $Nb_2O_5$. Then, the mixture is sintered via a multi-step process to produce the $MgNb_2O_6$. The sintering process includes heating the mixture at a temperature of about 1100° C. for about 12 hours, grinding the mixture to a powder, and reheating the ground mixture at a higher temperature of about 1200° C. for about 24 hours. After the multi-step sintering, the produced solid is reground to produce the powdered $MgNb_2O_6$.

In the exemplary embodiment, powdered $MgNb_2O_6$, powdered PbO, and powdered $TiO_2$ are combined to form a mixture in which stoichiometry proportions are chosen to produce a desired composition for solid body 22 after sintering. To produce a $(PMN)_{(1-x)}(PT)_x$ composition, the stoichiometric proportions of $MgNb_2O_6$, $TiO_2$, and PbO are selected to be equal to (1−x)/3, x, and (1+ϵ). The number "ϵ" is an excess of PbO that is introduced into the mixture to compensate for Pb evaporation during subsequent sintering.

In the exemplary embodiment, a multi-step process that sinters the mixture of $MgNb_2O_6$, $TiO_2$, and PbO to produce solid body 22. The multi-step process includes a first sintering of the mixture at about 900° C. for about 12 hours. The multi-step process includes a second sintering of the mixture at about 950° C. for about 12 more hours. The multi-step process includes a third sintering of the mixture at about 1200° C. to about 1250° C. for about 5 hours. The third sintering step is carried out in closed alumina crucibles to reduce Pb evaporation during this high-temperature sintering step and to enable better control on the final composition of the piezoelectric material. The second and third sinterings are performed at temperatures that would otherwise cause evaporation loss of Pb and thus, a lower molar percentage of Pb in the sintered solid body 22.

Even with a crucible that is cemented closed some evaporation of Pb occurs. To compensate for this evaporation of lead during sintering, the sintering mixture includes a stoichiometric excess "ϵ" of PbO. For the exemplary embodiment, the value of the excess ϵ is equal to about 0.05.

In the exemplary embodiment, electrodes 25, 26 are attached to the solid body 22 by performing a sputtering deposition of gold on opposite sides of the sintered body 22.

In the exemplary embodiment, electrodes 25, 26 are used to pole solid body 22 so that a permanent electric polarizability is produced along a direction perpendicular to the surfaces of electrodes 25, 26. The poling is done by maintaining the solid body 22 at a temperature of about 130° C. while applying a strong electric field across the electrodes 25, 26. The poling electric field has an intensity of about 7 to about 10 kilo-volts (kV) per centimeter (cm) and is applied across the electrodes 25, 26 for about 30 minutes. At the elevated poling temperature, the electric field causes crystalline domains in the solid body 22 to partially realign along the poling direction. After cooling the poled body 22 to room temperature, a permanent anisotropic polarizability remains.

Referring again to FIG. 3, the piezoelectric device 20 is used as a functional component of a variety of electromechanical devices. Some of these electromechanical devices are described below.

Figure 5:
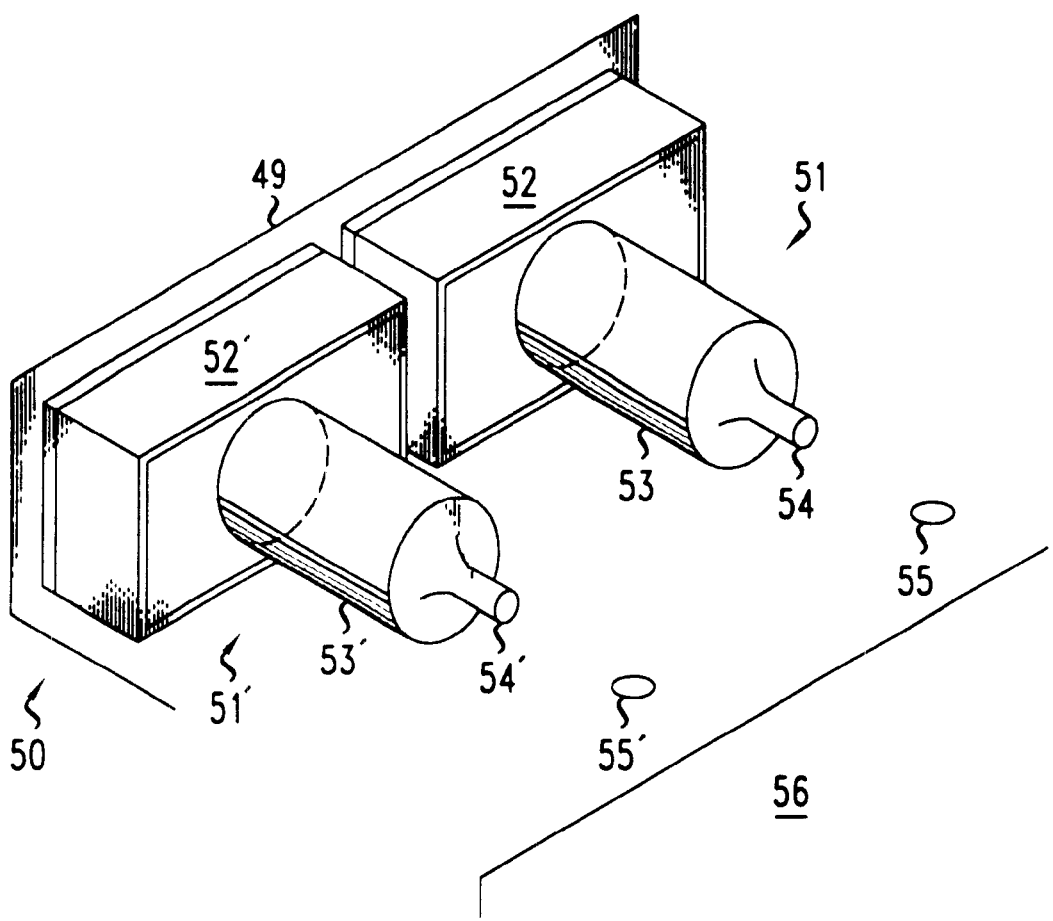
FIG. 5 is an oblique view of an inkjet print head that uses the piezoelectric device of FIG. 3.

FIG. 5 shows a portion of an inkjet print head 50 that includes an array of ink jets 51, 51' located on a support structure 49. The ink jets 51, 51' include piezoelectric devices 52, 52' that have constructions analogous to that of device 20 of FIG. 3. The ink jets 51, 51' include ink reservoirs 53, 53' with ink nozzles 54, 54'. The ink reservoirs 53, 53' have flexible back surfaces adjacent to the piezoelectric devices 52, 52'. Movements of the piezoelectric devices 52, 52' operate the ink jets 51, 51 ' by deforming the ink reservoirs 53, 53' and causing droplets of ink 55, 55' to be squirted from nozzles 54, 54' towards target spots on a sheet 56 of paper. The piezoelectric devices 52, 52' are controlled by external voltage sources (not shown).

Figure 6:
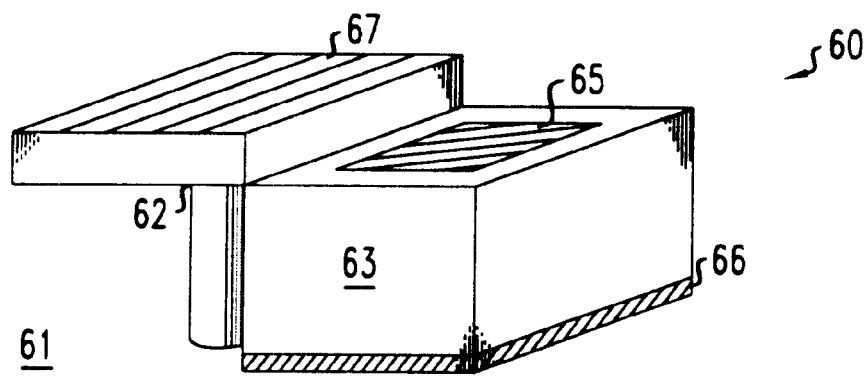
FIG. 6 is an oblique view of a micro-electro-mechanical (MEM) device that uses the piezoelectric device of FIG. 3.

FIG. 6 shows a micro-electro-mechanical (MEM) device 60. The MEM device 60 includes a supporting substrate 61, a flexible structure 62 connected to the substrate 61, and a piezoelectric device 63 having a construction analogous to that of device 20 of FIG. 3. The piezoelectric device 63 rests on the substrate 61 and mechanically couples to the flexible structure 62. The piezoelectric device 63 deforms in response to voltages applied to electrodes 65, 66 and functions as an actuator of the structure 62. The deformations of the piezoelectric device 63 cause the structure 62 to bend thereby changing the orientation of mirror surface 67 located thereon.

Figure 7:
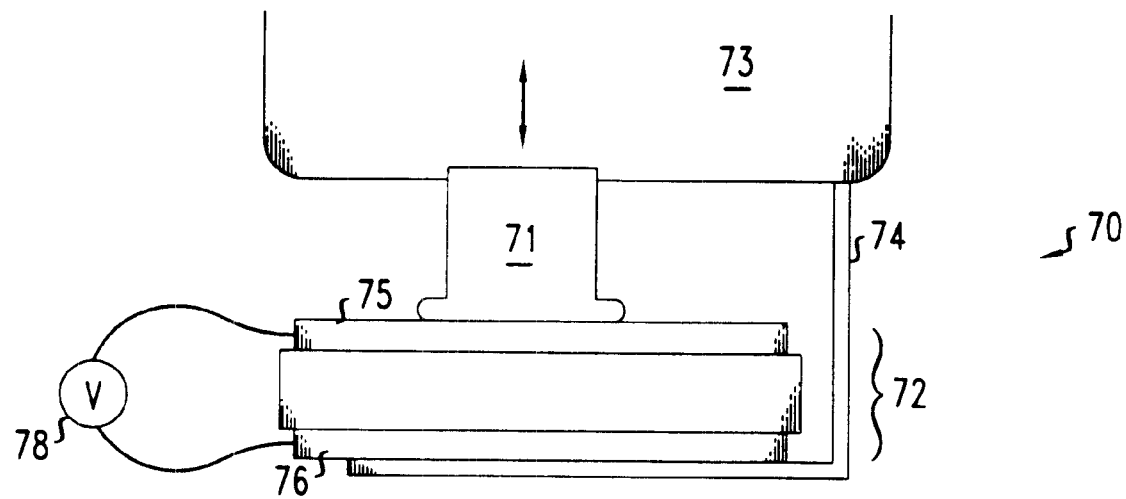
FIG. 7 is a cross-sectional view of a pressure gage that uses the piezoelectric device of FIG. 3.

FIG. 7 is a cross-sectional view of a pressure gage 70 that includes a moving sensor element 71 and a piezoelectric device 72 located on a support structure 74, e.g., the piezoelectric device 20 of FIG. 3. The mechanical element 71 moves vertically in response to pressure changes in chamber 73. Vertical movements of the mechanical element 71 cause deformations of the piezoelectric device 72. The deformations produce a voltage across electrodes 75, 76. The voltage is measured by a voltmeter 78 to determine the pressure in the chamber 73.

From the disclosure, drawings, and claims, other embodiments of the invention will be apparent to those skilled in the art.

What is claimed is:

1. A composition, comprising:
   a polycrystalline body having a stoichiometry that is described by $[Pb(Mg_{1/3}Nb_{2/3})O_3]_{(1-x)}[PbTiO_3]_x$, the value of x being in a range of about 0.31 to about 0.47.

2. The composition of claim 1, wherein the value of x is in a range of about 0.31 to about 0.4.

3. The composition of claim 2, wherein the value of x is in a range of about 0.32 to about 0.47.

4. The composition of claim 1, wherein the polycrystalline body comprises tetragonal crystalline domains.

5. The composition of claim 2, wherein the body has an anisotropic piezoelectric response.

6. The composition of claim 2, wherein the body comprises a dopant selected from a group consisting of lanthanum and cobalt, the dopant accounting for less than about 2 percent of the weight of the body.

7. A process to fabricate a solid body, comprising
   forming a mixture of powdered oxides, the oxides comprising one of lead, magnesium, niobium, and titanium; and
   sintering the mixture to produce a polycrystalline body whose stoichiometry is described by $[Pb(Mg_{1/3}Nb_{2/3})O_3]_{(1-x)}[PbTiO_3]_x$, the value of x being in a range of about 0.47 to about 0.31.

8. The process of claim 7, wherein the mixture of oxides comprises $PbO$, $MgNb_2O_6$, and $TiO_2$.

9. The process of claim 7, wherein a portion of the sintering is performed at a temperature above the vaporization temperature of lead, the portion of the sintering being performed in a container that reduces loss of vaporized lead.

10. The process of claim 7, further comprising:
    poling the composition with an electric field to produce a permanent piezoelectric responsivity to applied electric fields.

11. The process of claim 7, wherein the composition includes tetragonal crystalline domains.

* * * * *